United States Patent
Fullerton

(10) Patent No.: US 7,170,288 B2
(45) Date of Patent: Jan. 30, 2007

(54) PARAMETRIC NUCLEAR QUADRUPOLE RESONANCE SPECTROSCOPY SYSTEM AND METHOD

(76) Inventor: Larry W. Fullerton, 125 Peter La., New Hope, AL (US) 35760

( * ) Notice: Subject to any disclaimer, the term of this patent is extended or adjusted under 35 U.S.C. 154(b) by 0 days.

(21) Appl. No.: 11/303,711

(22) Filed: Dec. 17, 2005

(65) Prior Publication Data

US 2006/0132127 A1    Jun. 22, 2006

Related U.S. Application Data

(60) Provisional application No. 60/638,858, filed on Dec. 22, 2004.

(51) Int. Cl.
*G01V 3/00* (2006.01)
(52) U.S. Cl. ...................... 324/300; 324/312
(58) Field of Classification Search ................ 324/300, 324/312, 314
See application file for complete search history.

(56) References Cited

U.S. PATENT DOCUMENTS

| | | | |
|---|---|---|---|
| 5,159,617 A * | 10/1992 | King et al. .................... 378/57 |
| 5,585,722 A * | 12/1996 | Hosoki et al. .............. 324/318 |
| 5,642,393 A * | 6/1997 | Krug et al. .................... 378/57 |
| 6,127,824 A * | 10/2000 | Sydney Smith et al. .... 324/300 |
| 6,222,364 B1 * | 4/2001 | Smith et al. ................. 324/300 |
| 6,541,966 B1 * | 4/2003 | Keene ......................... 324/243 |

\* cited by examiner

*Primary Examiner*—Louis M. Arana
(74) *Attorney, Agent, or Firm*—James Richards

(57) ABSTRACT

A system and method for probing a specimen to determine one or more components by utilizing a first signal to excite the specimen at a nuclear quadrupole resonant frequency and observing changes in a specimen property. One exemplary property may be dielectric constant. Another exemplary property may be magnetic permeability. In one embodiment, the first signal is unmodulated and a second signal is observed for the presence of modulation at the frequency of the first signal. Alternatively, the first signal may be modulated and the second signal may be observed for the presence of the modulation. A system is disclosed wherein the specimen is excited using the first frequency and a radar at the second frequency is used to observe changes in radar reflectivity of the specimen due to the excitation.

18 Claims, 7 Drawing Sheets

PARAMETRIC NUCLEAR QUADRUPOLE RESONANCE SPECTROSCOPY SYSTEM AND METHOD

RELATED APPLICATIONS

This application claims the benefit under 35 USC 119(a) of U.S. Provisional application 60/638,858 filed Dec. 22, 2004 by Fullerton, which is hereby incorporated herein by reference in its entirety.

BACKGROUND

1. Field of the Invention

The present invention pertains to the field of materials detection and/or identification, more particularly to the field of detection of materials using RF probing energy.

2. Background of the Invention

Nuclear Quadrupole Resonance (NQR) is a well-known spectrographic technique that is used to detect and identify molecular structures by the characteristic NQR of atomic species contained within. Certain atoms' nuclei have the characteristic of absorbing RF energy when exposed to a frequency that causes its nucleus' spin axis to hop between several stable orientations. This is possible only if the particular nucleus has a non-symmetrical charge distribution that permits interaction with the atom's electron cloud non-symmetries. The complexity of these quasi-stable orientations typically leads to a series of closely spaced, narrow line width absorption lines. An example of such a nucleus is the common isotope Nitrogen-14.

This characteristic resonance has been used commercially to positively detect substances such as explosives contained within shipping containers. The method used is to sweep a local RF field through the frequencies of interest and, by using a bridge structure, measure the loading on the RF source as it passes through the resonances and use this information to identify the material under observation.

There are several technical difficulties with this method that limits its usefulness to very short range applications on the order of one meter, whereas it would be very useful to provide much greater range when dealing with materials such as explosives, i.e. tens of meters or further of standoff would be desirable.

Issues with the conventional NQR spectrographic techniques concern the ability to measure very small signals buried within very large ones, and the directionality of the frequencies used to stimulate the specimen under study.

There are two principal conventional NQR techniques. The first one relies on detecting a target's absorption of resonant radio frequency energy from an interrogator tuned to the specimen's resonant frequency. This is usually accomplished with a bridge configuration in which the voltage across a coil of wire acts as an exciter at the interrogating frequency and that voltage is nulled in a bridge circuit at a frequency that is near an expected resonance but not at it. When the exciter's frequency is tuned past a specimen's resonance, a signal appears in one arm of the bridge whose amplitude indicates the degree of absorption by the specimen. A problem with this approach is that the circuit impedance varies with frequency even if there is no resonance due to the reactive elements used in the exciter, and the RF impedance of the specimen may also vary as the frequency is swept during analysis. These effects conspire to limit the sensitivity of a spectrometer using this approach, a limitation that is typical of any spectrometric technique that uses the same frequency to interrogate as that to which the detector is sensitive. Examples of spectrometers for which this is not so are Raman and florescence spectroscopy, in which the illumination frequency is very different than the response of the specimen, so the illuminator can easily be filtered out and the detector can therefore be made very sensitive to the alternate frequency since it is not blinded by its interrogator.

The second major type of conventional NQR spectrometer is based on producing an echo from the sample. In this method the interrogator emits a pulse of resonant frequency energy toward a specimen under study, and then its receiver listens for immediate re-emission of the same frequency energy when the interrogator is turned off. This mode is less prone to blinding by the interrogator but is less sensitive over all because of three effects. First, the average energy available to excite the specimen is lowered by the duty cycle of the system. Second, its noise figure is worsened by the necessity to pass wide band RF pulses thereby increasing the level of thermal noise in the receiver. The latter effect is particularly bad since the resonances can have bandwidths of single Hertz while the millisecond time delay of the echo mandates a minimum bandwidth of several kilohertz, increasing the noise figure on the order of 30 dB. The third problem with the echo approach is the very high transmit/receive signal loss. The amount of RF energy stored up to be reemitted is quite small, so it is a weak signal to start with.

All of the resonances of nuclei that are of interest occur below about 1GHz. Nuclei that resonate toward the high end of this range may benefit from directional interrogators but many important species occur in the hundreds of KHz to a few 10's of MHz. Nitrogen 14 is particularly important to the detection and identification of hidden explosives and these are in the few MHz range and below. Antennas that operate in this range are either very large or will experience very poor directionality. Thus, even if a stand-off system is constructed that overcomes the sensitivity limitations previously described it will typically not be able to resolve its location in the field with sufficient accuracy to locate it.

Atmospheric and man-made noise in this frequency range is far above thermal limits so even if the system is ideally constructed its sensitivity may be further limited by ambient rather than system noise.

These factors combined yield a very short range of operation, and commercial systems therefore operate in near proximity to the target, on the order of 1 meter or less range. This range is entirely unsatisfactory for many applications such as locating hidden explosives that are connected to trip wires.

Thus, there is a need for a non-destructive system for detecting and identifying materials, where the system may be used at a distance from the material and may incorporate sufficient directionality to locate the material within the range of the system.

BRIEF SUMMARY OF THE INVENTION

Briefly, the present invention is a system and method for probing a specimen to determine one or more components by utilizing a first signal to excite the specimen at a nuclear quadrupole resonant frequency and observing changes in a specimen property. One exemplary property may be dielectric constant. Another exemplary property may be magnetic permeability. In one embodiment, a second signal is used to probe the material to observe changes in the property.

In one embodiment, multiple frequencies may be excited separately or otherwise to further determine one or more components of the specimen.

In one embodiment, the first signal is unmodulated and the second signal is observed for the presence of modulation at the frequency of the first signal.

Alternatively, the first signal may be modulated and the second signal may be observed for the presence of the modulation.

A system is disclosed wherein the specimen is excited using the first frequency and a radar at the second frequency is used to observe changes in radar reflectivity of the specimen due to the excitation. In one embodiment the first frequency is modulated and the radar return signal is processed using synchronous processing to detect the modulation on the radar return signal.

The system may be used to detect materials by utilizing probe signal energy transmitted through the material, scattered by the material or reflected from the material.

BRIEF DESCRIPTION OF THE FIGURES

The present invention is described with reference to the accompanying drawings. In the drawings, like reference numbers indicate identical or functionally similar elements. Additionally, the left most digit(s) of a reference number identifies the drawing in which the reference number first appears.

DETAILED DESCRIPTION OF THE PREFERRED EMBODIMENTS

Figure 1:
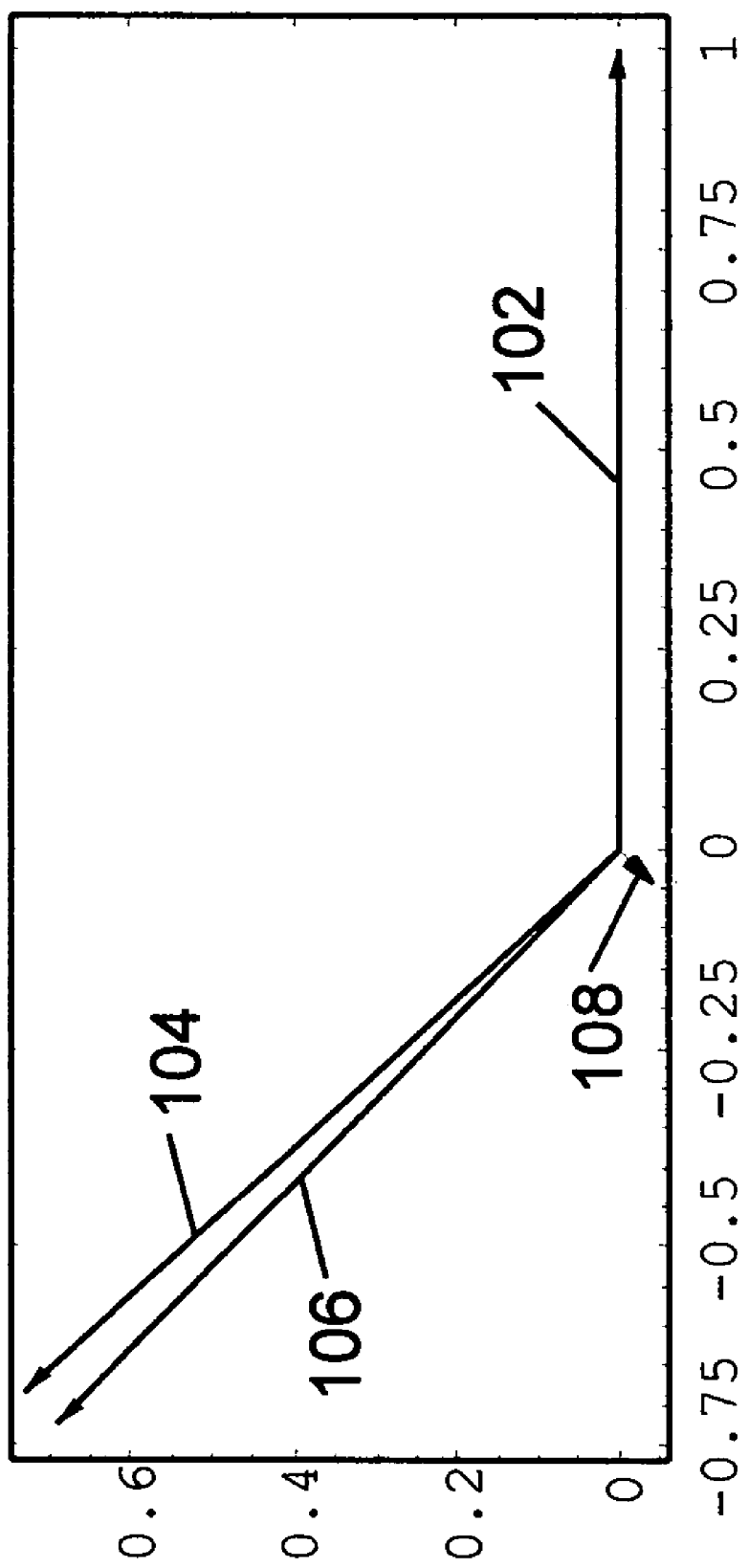
FIG. 1 depicts an exemplary calculation of the angle modulation of a probe signal when the dielectric constant of the material is modulated 1.0% by an excitation field in accordance with the present invention.

The present invention discloses a method that overcomes many of the shortcomings of the conventional methods of Nuclear Quadrupole Resonance (NQR) spectroscopy. The invention uses two separate signals, the first signal at one of the resonant frequencies of the specimen and the second signal at a frequency that responds to changes in either the specimen's dielectric constant, magnetic permeability or other related property, which are induced by the first signal. Since the principle of operation is based on a parametric modulation or variation, the process of the present invention may be termed Parametric Nuclear Quadrupole Resonance (PNQR) spectroscopy.

The basic principle of PNQR spectroscopy is the detection and measurement of the interaction between the quadrupole electric field of an atom's nucleus and its own valence electrons. This interaction is maximized when an exciting radio frequency field's frequency is equal to a resonance of this interaction in a given atom. The charge distribution and electric polarization of the valence electrons in a molecule are the source of the dielectric constant of the material, which relates to the energy that is stored in a volume of material when it is exposed to a given electric dipole field. The dielectric constant is also responsible for determining the speed that light and radio waves propagate through the material. When a material is excited at its resonant frequency by an external radio frequency (RF) field, the resonance response will also have the effect of modulating the macro dielectric constant of the material. The change in dielectric constant may be observed, however, at other frequencies. In particular, the speed of propagation of other frequencies may be modified. Therefore when the material is interrogated with a signal at a different and non-resonant radio frequency by passing the signal through the material, at the same time that it is being excited with a signal at the resonant frequency, then the non-resonant signal will be phase modulated (as a result of the varying delay) as it passes through the material. Note that the material may be interrogated by the non-resonant frequency signal by receiving any portion of the probe signal that is influenced by the bulk of the material. Thus the signal may pass through the material in one direction, or be reflected or partially reflected, or be scattered by the material. In all these cases, the signal propagation is influenced by the material in accordance with the material dielectric constant and the signal propagation will be influenced by changes in the dielectric constant induced by the excitation field.

To summarize, a material to be analyzed is excited with a first RF field that has frequency components at the NQR frequency of the material. The same material is also illuminated by second RF signal at a different frequency, and the phase modulation of the latter signal, after passing through the sample, is analyzed for modulation by the first RF field.

In a further aspect of the invention, the sensitivity may be further improved by modulating the exciting signal and detecting the modulation on the second signal. This aspect may be better understood with reference to exemplary embodiments. In a first exemplary embodiment, the first RF signal may be a 3 MHz signal broadcast by a vertical dipole antenna, and 100% amplitude modulated by a 1 KHz sine wave. The second signal may be a 10 GHz signal that is scattered off of the material, in a manner similar to a radar. The second signal may be transmitted via a directional antenna such as a parabolic dish or a helical antenna. When the 10 GHz signal is directed at the material some of the energy may penetrate the material, traveling through the material, reflecting from one or more boundaries, and traveling back through the material, and propagated back to the radar receiver. The reflected 10 GHz signal is then analyzed for evidence of the 1 KHz modulation. In contrast to the conventional prior art the exemplary system presents a number of benefits:

1. Both man-made and atmospheric noise is negligible at 10 GHz, so operation is only limited by good receiver design and the thermal noise of the receiver.
2. Since both the first signal and second signal may use CW carriers (100% duty cycle) the power on target is maximized with resulting sensitivity improvement.
3. The target's low frequency resonance (e.g. 3.41 MHz) is parametrically converted to the microwave regime (e.g. 10 GHz) in this example so transmit/receiver isolation is very good and again system sensitivity is maximized.
4. The microwave frequency of the second signal (e.g. 10 GHz) permits high directivity in a portable package so that materials such as hidden explosives can be readily located.

5. The modulation frequency is offset from the microwave carrier frequency of the second signal, which further improves the sensitivity and dynamic range of the receiver.

In an alternative embodiment, the first signal is unmodulated and the reflected second signal is analyzed only for modulation effects at the actual RF frequency of the first signal.

The present invention may be better understood with reference to the Figures. FIG. 1 depicts an exemplary calculation of the angle modulation of a probe signal when the dielectric constant of the material is modulated 1.0% by an excitation field in accordance with the present invention. FIG. 1 is based on a 1.5 cm thick slab of material whose dielectric constant of 3.5 is modulated 1% by a PNQR bias signal at 3.41 MHz. FIG. 1 shows the relative phase of a 10 GHz probe signal reflected from the material. Referring to FIG. 1, vector 102 represents a reference reflection from the front surface of the material. Vector 104 represents the relative angle of a reflection from the back surface of the material with no 3.41 MHz excitation present. Vector 106 represents the relative angle of the reflection from the back surface of the material with 3.41 MHz excitation present. The difference between vector 104 and vector 105 is shown as vector 108, which is the modulation due to the 3.41 MHz excitation. The phase shift results from the propagation delay through the material, which in turn is a function of the dielectric constant. As the dielectric constant is increased, the delay is increased resulting in a phase shift of the RF signal propagating through the material. Thus, the phase shift is increased by increasing the thickness of the material, or increasing the RF probe frequency, or increasing the amplitude of the excitation frequency.

In the example shown in FIG. 1, the difference vector 108 is 24 dB below the reflection signal, vector 104. With a probe signal of 30 GHz, the same signal delay would produce a larger phase delay, resulting in a difference vector of 15 dB below the reflection, improving detection by 9 dB. Likewise, a probe signal of 60 GHz would result in a difference vector 9 dB below the reflection. In a similar manner, a thicker material cross section would also increase the modulation. For example a material cross section of 3 cm would result in a difference vector 18 dB below the reflection at 10 GHz, a six dB increase from the 1.5 cm thickness.

Figure 2:
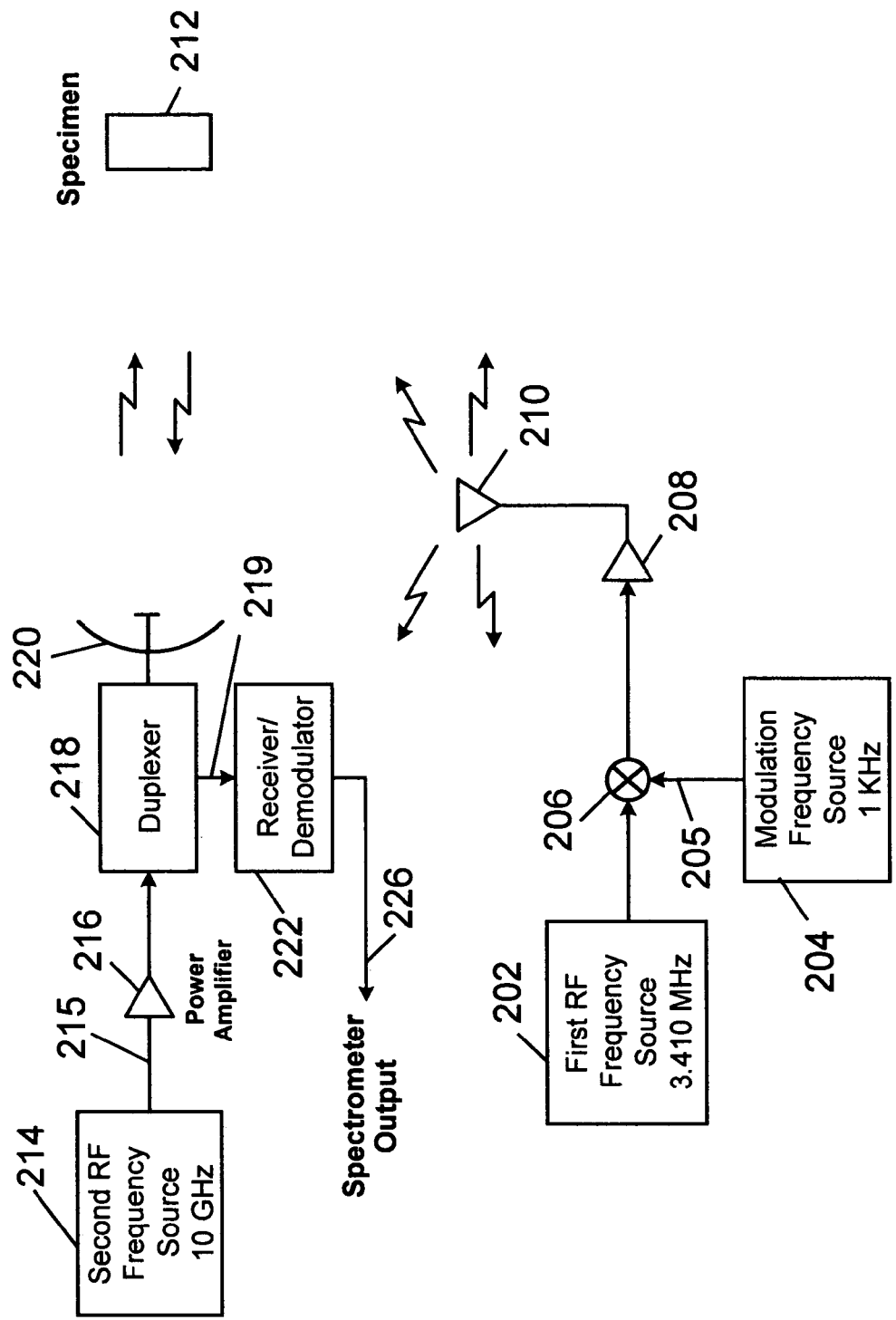
FIG. 2 illustrates an exemplary system for exciting the material and detecting the modulated reflection signal in accordance with the present invention.

FIG. 2 illustrates an exemplary system for exciting the material and detecting the modulated reflection signal in accordance with the present invention. Referring to FIG. 2, a first RF frequency source 202 is tuned to a resonant frequency of interest for a material of interest. For example the-frequency may be 3.410 MHz, which is a frequency for nitrogen, which is abundant in typical explosives. The RF signal from the first RF frequency source 202 is modulated 206 by a modulation signal 205 from a modulation frequency source 204. For example the modulation may be a 1 kHz sine wave producing 100% AM modulation. Alternatively, the modulation may be a square wave, producing on-off carrier modulation or another waveform, as desired. The modulated first RF signal is amplified 208 and transmitted via an antenna 210. The first RF signal (also called excitation signal or bias signal) may be transmitted omni directionally, in part because short range directional transmission of frequencies on the order of a few megahertz is typically impractical, however directionality may be used if desired, and may be more practical at the higher excitation frequencies. An omni directional antenna 210 is depicted in FIG. 2. The excitation signal impinges on the specimen 212 and modulates the dielectric constant as described.

A second RF frequency source 214 and amplifier 216 generate a second RF signal (also called a probe signal,) typically at a microwave frequency. The probe signal is directed to the specimen 212 using a directional antenna 220. A reflected signal from the specimen is then received by the directional antenna 220, coupled through a duplexer or TR Switch 218, and processed by a receiver 222 to detect variations in the reflected signal due to the modulation of the dielectric constant of the specimen 212. The detected modulation level may then be presented as a spectrometer output 226. The probe transmitter and receiver are similar in functionality to a radar. A number of techniques may be used including systems similar to CW Doppler radar, pulsed radar, and UWB radar. A particular adaptation of the radar is to process the received signal to detect slight phase variations that vary in accordance with the modulation. In one embodiment, a filter tuned to the modulation frequency is used. In another embodiment, the modulation signal itself is used to coherently, or synchronously process the received signal to detect the induced variations. In another embodiment, a UWB radar is scanned over a range of distances in discrete steps. At each step, the return signal is processed to detect the induced modulation.

Figure 3:
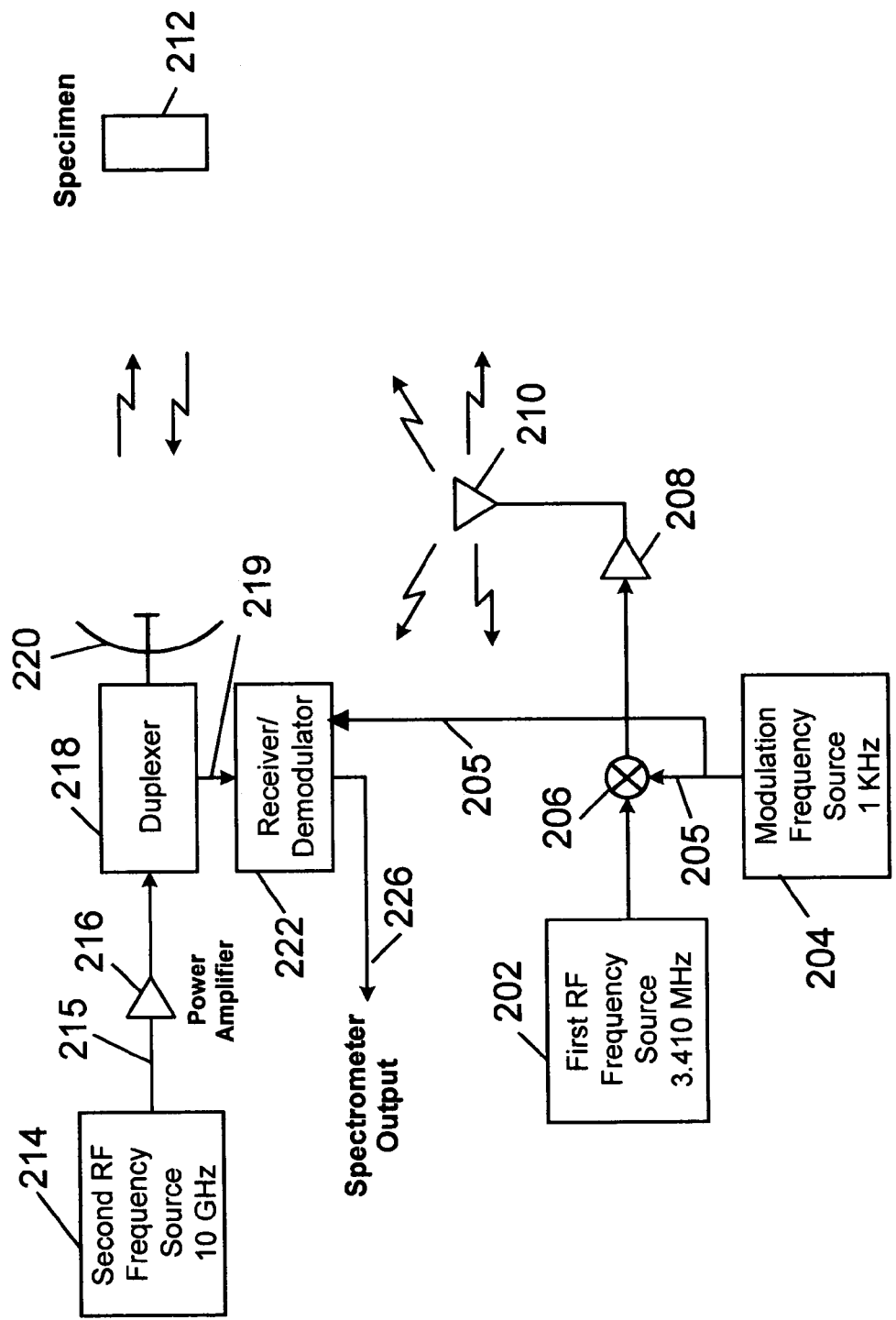
FIG. 3 illustrates the system of FIG. 2 further including the use of the modulation signal information to process the received probe signal.

FIG. 3 illustrates the system of FIG. 2 further including the use of the modulation signal information to process the received probe signal. Referring to FIG. 3, the modulation signal 205 is coupled to the receiver demodulator 222 to synchronously process the received signal 219 to detect variations that are synchronous with the modulation 205. In an alternate embodiment, the receiver demodulator 222 may provide the modulation signal 205 to the modulator 206, or the receiver demodulator 222 and modulator 206 may be fed from a timing generator (not shown). In essence, the modulator 206 and receiver demodulator 222 operate in identical phase and frequency to achieve the synchronous (coherent) processing. In one embodiment, the received signal 219 may be processed by a multiplier circuit and the modulation signal 205 may be a sine waveform fed to the modulator 206 and to the receiver 222. In another embodiment, the receiver circuit 222 may operate on modulation polarity information only, i.e. a square wave of +1 and −1 value may be sent to the receiver 222 to reverses the polarity of the received signal 219 in phase with the modulation 205 to detect variations that are synchronous with the modulation 205. The synchronous processing may be followed by a low pass filter with a bandwidth of only a few Hertz to maximize signal to noise and improve the range of the system.

Figure 4:
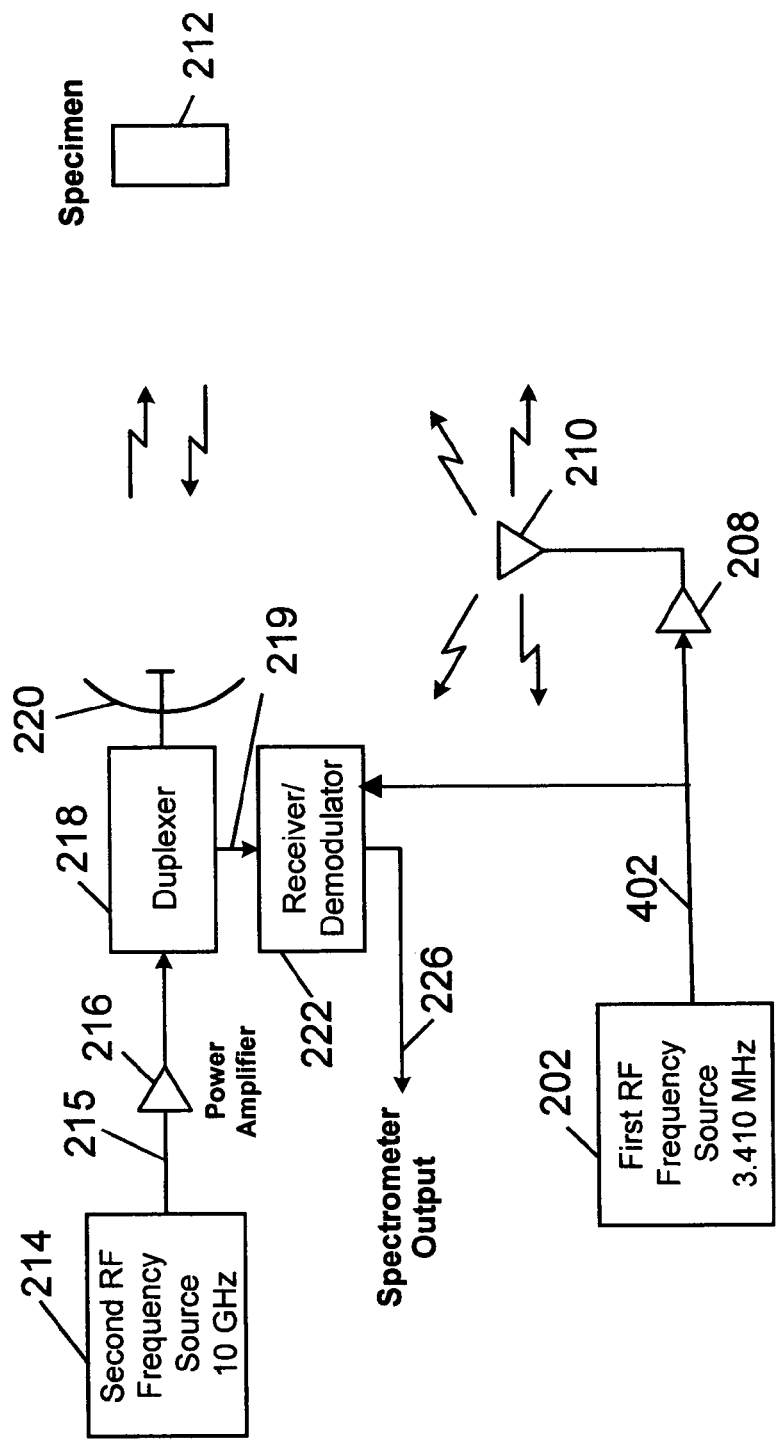
FIG. 4 illustrates a system that utilizes an unmodulated excitation signal.

FIG. 4 illustrates a system that utilizes an unmodulated excitation signal 402. Referring to FIG. 4, a continuous unmodulated excitation signal 402 is transmitted by the excitation transmitter 208. The probe radar generates a probe signal and receives a reflection. The receiver processor 222 synchronously detects induced variations of the received signal 219 at the excitation frequency 202.

Figure 5:
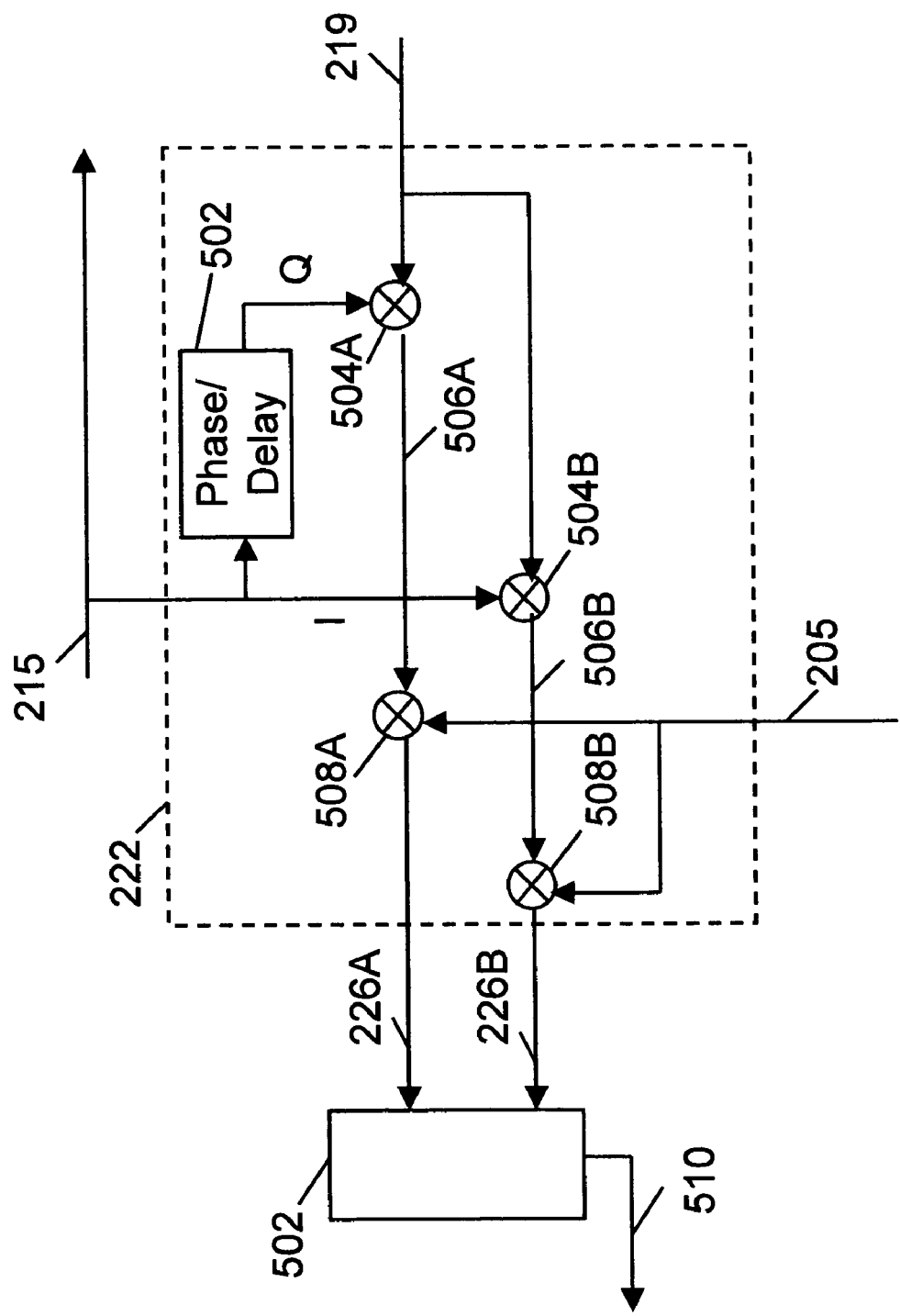
FIG. 5 illustrates further details in one embodiment of the receiver demodulator.

FIG. 5 illustrates further details in one embodiment of the receiver demodulator. Referring to FIG. 5, the receiver demodulator 222 first coherently detects the received signal 219 at detectors 504A and 504B by using the transmitted signal frequency information 215 to produce received signals 506A and 506B at a first baseband. The received signals may then be filtered if desired (not shown). The received signals are then further coherently processed at multipliers 508A and 508B using the modulation frequency information 205. Note also that the probe transmitter signal 215 is divided into an in-phase (I) and quadrature phase (Q) version to produce an in-phase 506B and quadrature 506A baseband to insure that the signal 219 will always be detected in one channel 504A or the other 504B, irrespective of the actual incoming RF phase of the signal 219.

The modulation signal 205 is used to multiply the received I 506B and Q 506A signals to yield detection outputs 226A and 226B. The detection outputs are fed to a processor 502 to generate the final detection signal 510. The I 226A and Q 226B detection outputs may be filtered with a low pass filter (part of processor 502). The bandwidth of the filter may be selected to trade the benefits of low signal to noise with the benefits of fast response. The I 226A and Q 226B outputs may be combined for a combined response output 510. The combination function may be ideally the square root of the sum of the squares of the two signal values, or may be a simpler absolute value summation or a logic OR function combining a threshold detection on each signal 226A or 226B.

Figure 6:
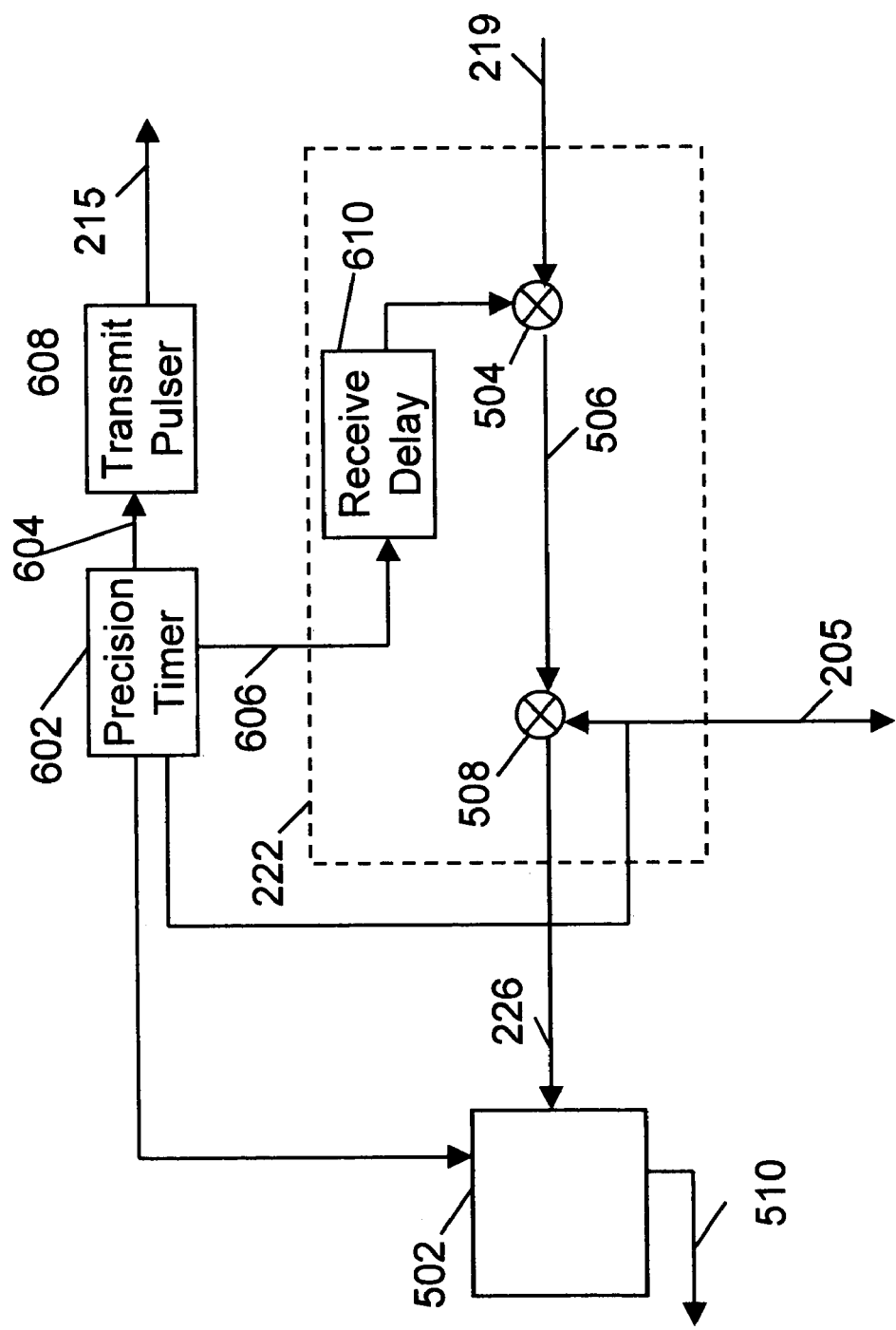
FIG. 6 illustrates a PNQR system based on an Ultra Wideband Radar.

FIG. 6 illustrates a PNQR system based on an Ultra Wideband Radar. Referring to FIG. 6, a precision timer 602 provides timing signals 604 to a transmit pulser 608, which generates and transmits UWB pulses. The precision timer 602 also provides timing signals 606 to a receiver delay 610 that provides the proper delay for receiving the reflected UWB pulses 219. The receive delay 610 is typically scanned in steps over a range of delays corresponding to a span of distances from the probe radar. At each distance, the received pulses 219 are coherently detected 504 to produce a baseband signal 506. The baseband signal 506 is then further processed by coherent processing 508 with respect to the modulation signal 205. In the embodiment shown, the modulation signal 205 and the coherent processing signal 205 are provided by the precision timer 602. The baseband signal 506 is multiplied by the coherent processing signal 205 to yield the spectrometer output 226, which may be further processed by a processor 506, which may include low pass filtering or thresholding as needed for the application.

Advantages of the UWB system include two dimensional location, i.e., location can be further defined in range as well as angle. Further, given a known (measured) range and a detected signal magnitude, the amount of material may be estimated.

In another embodiment, other techniques such as chirped, swept, or PN coded signals may be used to provide range resolution.

Figure 7:
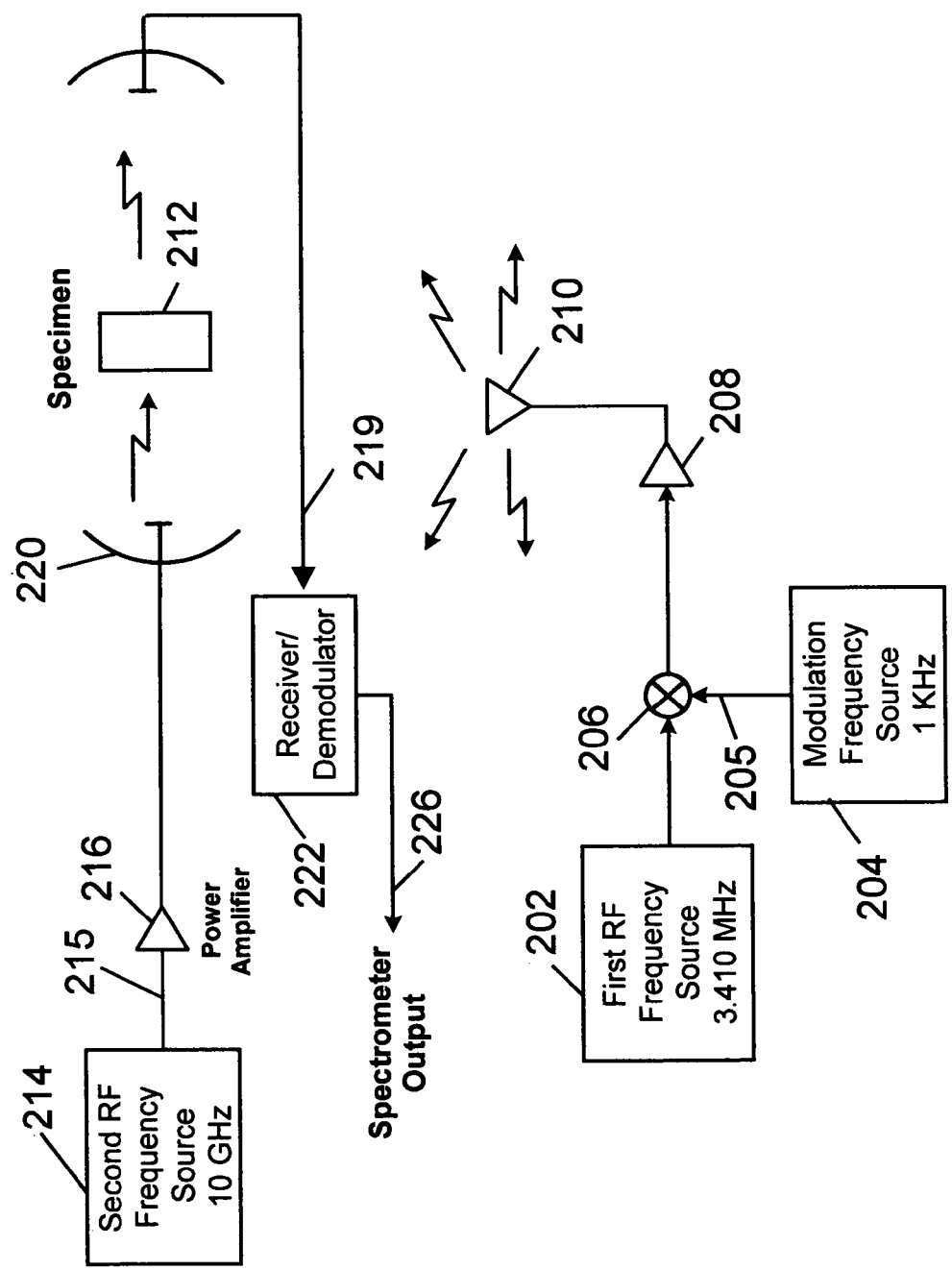
FIG. 7 shows an alternative embodiment wherein the probe signal passes through the material in one direction.

FIG. 7 shows an alternative embodiment wherein the probe signal passes through the material in one direction. For some applications, such as for example, but not limited to, inspecting articles on an assembly line, or inspecting luggage at an airport, it may be desirable to utilize a pass through arrangement wherein the RF probe signal is passed through the material rather than reflected from or scattered by the material.

Applications

The invention has applications in commercial, industrial, mining, survey, security, military, and other. The system may be used to search for minerals, inspect items on a production line, or measure the mix of ingredients in chemical processes, or look for veins of ore, inspect airline baggage or passengers, look for roadside improvised explosive devices, de-mining farmland and other applications where material detection and/or identification is needed.

The system may be made portable or mobile for survey type applications, or may be made fixed for industrial process applications or security monitoring.

In operation, the system may typically tune the excitation frequency to a number of resonant frequencies in the desired material and evaluate each frequency to more positively determine the material or may tune to the frequencies of different materials to help distinguish between different materials and reject false alarms.

Variations

The functional elements described herein may be implemented in digital or analog circuits or a combination. A computer or processor may include associated function blocks and may be implemented using a programmable computer, digital logic, state machine, signal processor or digital controller technology. Transceiver function blocks shown separate from the processor may be implemented within a physical processor in a given implementation.

Conclusion

Thus described is a non-destructive system for detecting and identifying materials, where the system may be used at a distance from the material and may incorporate sufficient directionality to locate the material within the range of the system.

While particular embodiments of the invention have been described, it will be understood, however, that the invention is not limited thereto, since modifications may be made by those skilled in the art, particularly in light of the foregoing teachings. It is, therefore contemplated by the appended claims to cover any such modifications that incorporate those features or those improvements which embody the spirit and scope of the present invention.

What is claimed is:

1. A method for identifying a material comprising the steps of:
    exciting the material with an excitation signal, said excitation signal adjusted to a nuclear quadrupole resonance frequency of said material;
    determining a change in a property of said material, said change resulting from the excitation signal; and
    identifying the material based on said change in said property wherein said property is a dielectric constant, or a magnetic permeability.

2. A method for identifying a material comprising the steps of:
    exciting the material with an excitation signal, said excitation signal adjusted to a nuclear quadrupole resonance frequency of said material;
    determining a change in a property of said material, said change resulting from the excitation signal: and
    identifying said material based on said change in said property, wherein said property is a propagation delay through said material.

3. The method of claim 2, wherein the excitation signal is modulated and the change in said material property is determined by detecting a modulation of the propagation delay through the material resulting from the modulation of the excitation signal.

4. The method of claim 3, wherein the propagation delay is determined by propagating a probe signal through the material and measuring a delay of said probe signal resulting from said excitation signal.

5. The method of claim 3, wherein determining the propagation delay includes the steps of:
    directing a probe signal toward the material;
    detecting probe signal energy reflected from said material;
    measuring a signal delay in said reflected probe signal energy, said signal delay resulting from said excitation signal.

6. The method of claim 5 wherein the step of measuring a signal delay in said reflected probe signal energy includes the step of:

coherently processing said reflected probe signal energy based on said modulation of said excitation signal.

7. The method of claim 6 wherein the coherent processing of said reflected probe signal energy is based on the phase of said modulation of said excitation signal.

8. A system for identifying a material, said system comprising:

a first transmitter, transmitting an excitation signal to said material, said excitation signal being tuned to a nuclear quadrupole resonance frequency of said material;

a second transmitter, transmitting a probe signal to said material;

a receiver receiving probe signal energy from said material, said receiver generating a baseband signal; and a processor, said processor detecting a change in said baseband signal, said change resulting from said excitation signal.

9. The system as in claim 8, wherein said received probe signal energy is scattered from, reflected by, or transmitted through said material.

10. The system as in claim 8, wherein said probe signal is continuous wave or is pulsed.

11. The system as in claim 8, further including a modulator, wherein the excitation signal is modulated by the modulator.

12. The system as in claim 11, wherein said processor synchronously detects said received signal with respect to said modulation.

13. The system as in claim 12, wherein said processor synchronously detects said received signal with respect to the phase of said modulation.

14. The system as in claim 12, wherein said processor coherently detects said received signal with respect to the waveform of said modulation.

15. The system as in claim 8, wherein the probe signal is an Ultra Wideband signal.

16. The system of claim 15, further including Ultra Wideband distance determination capability, wherein the distance of said material is determined using the Ultra Wideband signal.

17. The system as in claim 8, wherein the excitation signal is tuned to each of a plurality of nuclear quadrupole resonant frequencies of said material and said processor detects said change in said baseband signal for each of said plurality of resonant frequencies.

18. A system for identifying a material comprising:

a first transmitter for exciting said material at a nuclear quadrupole resonant frequency of said material;

a second transmitter for directing a probe signal toward said material;

a receiver for receiving a reflected probe signal from said material;

a processor for detecting a change in a property of the reflected signal resulting from said excitation of said material.

\* \* \* \* \*